United States Patent [19]

Cohen

[11] 3,865,590

[45] Feb. 11, 1975

[54] GRAVURE PRINTING PLATES

[75] Inventor: David Lionel Cohen, Pontypool, England

[73] Assignee: Imperial Chemical Industries Limited, London, England

[22] Filed: May 29, 1973

[21] Appl. No.: 364,636

[30] Foreign Application Priority Data

June 30, 1972 Great Britain .................... 30768/72

[52] U.S. Cl. ...................................... 96/38, 96/35.1

[51] Int. Cl. ............................ G03f 5/00, G03f 7/24

[58] Field of Search ................................ 96/38, 35.1

[56] References Cited

UNITED STATES PATENTS

| | | | |
|---|---|---|---|
| 2,149,846 | 3/1939 | Johnson | 96/38 |
| 3,038,800 | 6/1962 | Luckey et al. | 96/35.1 |
| 3,053,745 | 9/1962 | Levinos | 96/35.1 |
| 3,102,030 | 8/1963 | Hoerner | 96/35.1 |
| 3,194,661 | 7/1965 | Cohen | 96/35.1 |
| 3,770,435 | 11/1973 | Volkert | 96/38 |

*Primary Examiner*—David Klein
*Attorney, Agent, or Firm*—Cushman, Darby & Cushman

[57] ABSTRACT

Gravure printing plates are prepared by (1) producing a hardened cell pattern in a surface of a layer of a composition comprising (a) a resin material which is hardened on exposure to electromagnetic radiation (b) a silver halide which, as a result of exposure to electromagnetic radiation insufficient to cause appreciable hardening of the resin, produces an image which is resistant to the transmission of hardening radiation, (2) submitting the exposed resin material to an oxidative treatment (3) producing in that surface of the material an image which is resistant to the transmission of hardening radiation, (4) exposing the layer to hardening radiation, preferably through its other surface, (5) removing from the first surface of the layer from within the hardened cell walls relatively less hardened resin.

3 Claims, No Drawings

GRAVURE PRINTING PLATES

The present invention relates to an improved method for the manufacture of Gravure printing plates.

In British Patent Application No. 40545/69 there is disclosed a method for making a Gravure printing plate which comprises the steps of:

1. producing a hardened cell pattern in a surface of a layer of a composition comprising a resin material which is hardenable on exposure to electro-magnetic radiation (herein called "hardening radiation"),
2. producing in that surface of the layer an image in material which is resistant to the transmission of hardening radiation,
3. exposing the layer to hardening radiation, preferably through its other surface,
4. removing from the first surface of the layer from within the hardened cell walls relatively less hardened resin.

The hardening radiation employed (for example, ultra-violet radiation) to produce the cross-linking cell pattern normally results in fogging of the photographic component to the extent that an image cannot be subsequently obtained. Such fogging occurs since the radiation sensitive resin material is a turbid medium and multiple scattering of the radiation takes place, the photographic component (which is typically a silver halide) is generally sensitive to the same radiations that initiate cross-linking to produce the hardened cell pattern as well as to visible light and also the photographic component is very much more sensitive to ultra-violet radiation (the normal hardening radiation) than is the cross-linking system.

When forming the hardened cell pattern by the use of ultra-violet light as hardening radiation, scattered radiation results in broadening the cell walls and in limiting the depth of the cells. Consequently, it is necessary to use minimum exposure to achieve cross-linking of the cell structure. However, even under conditions of minimal exposure the proportion of scattered radiation is frequently sufficient to fog the photographic component, e.g., a silver halide dispersion.

We have now found that the effect of the fogging can be ameliorated by treating the resin with an oxidising agent after having exposed it to the hardening radiation. Such oxidative treatment destroys the latent fog image and the required image can then be formed by normal exposure to give a latent image followed by normal photographic processing.

The oxidising treatment may be carried out between stages (1) and (2) of the process referred to hereinbefore.

Accordingly, therefore, the present invention provides a modified process for making printing plates comprising:

1. producing a hardened cell pattern in a surface of a layer of a composition comprising a resin material which is hardenable on exposure to electro-magnetic radiation, (hardening radiation),
2. submitting the resin material after exposure to electro-magnetic radiation to an oxidative treatment,
3. producing in that surface of the layer an image in material which is resistant to the transmission of hardening radiation,
4. exposing the layer to hardening radiation, preferably through its other surface, 5. removing from the first surface of the layer from within the hardened cell walls relatively less hardened resin.

The oxidative treatment preferably comprises immersion in a solution of an oxidising agent. Suitable oxidising agents are, for example, chromic acid, potassium ferricyanide and ammonium persulphate. The preferred solution contains a mixture of ferricyanide and bromide ions which will oxidise the silver nuclei formed by exposure of a silver halide to electromagnetic radiation to silver bromide.

The invention will now be more fully described with reference to the following example which compares the production of a film containing a photographic image with and without an oxidising treatment to eliminate fogging.

EXAMPLE (a) A photosensitive film is prepared as follows:

| Component | Weight | Dissolved in Methanol | Dissolved in Water |
|---|---|---|---|
| Maranyl D100* | 10 g | 60 g | 10 g |
| Methylene bis-acrylamide | 1 g | 19 g | — |
| Benzophenone | 0.5 g | 4.5 g | — |
| Potassium bromide | 0.248 g | 5 g | 5 g |
| Silver nitrate | 0.352 g | 5 g | 5 g |

* Maranyl D100 is the registered Trade Mark of ICI for a copolymer of 6.6, 6.10 and 6 nylon in the proportion 40, 30, 30% by weight of copolymer.

The nylon copolymer "Maranyl D100" is dissolved in the methanol/water mixture and solutions of the other components added in turn with stirring; the operation is carried out under safelight illumination. The solution is cast onto a level glass plate at the rate of 10 g per square decimetre. The film is kept under cover until set and then allowed to dry at room temperature. When dry the film is stripped off the glass plate.

(b) A film prepared as (a) is exposed to tungsten illumination through a photographic step wedge tablet. The exposed film is developed in a conventional metol/hydroquinone photographic developing solution and fixed in a solution of sodium thiosulphate. Both solutions contain a proportion of methanol to assist penetration. A good silver image is obtained with a low fog level.

(c) A film prepared as (a) is exposed to ultraviolet radiation (low pressure mercury lamp, 5 minutes, exposure at 20 cm) through a Gravure screen. A part of this film is then further exposed as (b). Both parts then photographically processed as (b). Both are completely fogged and no image of the wedge is visible on the part so exposed.

(d) A film prepared as (a) and exposed to ultraviolet through a Gravure screen (c) is immersed for 2 minutes in a solution of:

| | |
|---|---|
| Potassium ferricyanide | 20 g |
| Potassium bromide | 20 g |
| Water | 300 ml |
| Methanol | 100 ml |

followed by a 4 minute wash in water.

After drying, the film is exposed and processed as (b). A silver image of the step wedge is obtained superimposed on a faint image of the lines of the Gravure screen.

What we claim is

1. In a process for the manufacture of Gravure printing plates which comprises:

a. producing a hardened cell pattern in a surface of a layer of a composition comprising a resin material which is hardenable on exposure to electro-magnetic radiation, (hardening radiation), and a silver halide in which, as a result of exposure to electro-magnetic radiation insufficient to cause appreciable hardening of the resin, an image can be produced which is resistant to the transmission of hardening radiation, b. producing in that surface of the layer an image in material which is resistant to the transmission of hardening radiation, c. exposing the layer to hardening radiation, preferably through its other surface, and d. removing from the first surface of the layer from within the hardened cell walls relatively less hardened resin, the improvement which comprises submitting the resin material after exposure to electro-magnetic radiation in step (a) to an oxidative treatment prior to step (c) whereby the effect of fogging of the image is ameliorated.

2. A method according to claim 1, wherein the oxidative treatment comprises immersion in a solution of an oxidising agent.

3. A method according to claim 2, wherein the oxidising agent is chromic acid, potassium ferricyanide or ammonium persulphate or bromide ions.

* * * * *